US012696723B2

(12) United States Patent
Teusch et al.

(10) Patent No.: US 12,696,723 B2
(45) Date of Patent: Jul. 28, 2026

(54) CONTACTLESS CONVEYOR DEVICE

(71) Applicant: Robert Bosch GmbH, Stuttgart (DE)

(72) Inventors: Stefan Teusch, Reutlingen (DE); Heike Raatz, Stuttgart (DE); Joachim Frangen, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 514 days.

(21) Appl. No.: 18/044,538

(22) PCT Filed: Aug. 31, 2021

(86) PCT No.: PCT/EP2021/073955
§ 371 (c)(1),
(2) Date: Mar. 8, 2023

(87) PCT Pub. No.: WO2022/069130
PCT Pub. Date: Apr. 7, 2022

(65) Prior Publication Data
US 2023/0360943 A1 Nov. 9, 2023

(30) Foreign Application Priority Data

Sep. 29, 2020 (DE) ..................... 10 2020 212 223.7

(51) Int. Cl.
*H10P 72/30* (2026.01)

(52) U.S. Cl.
CPC ...... *H10P 72/3411* (2026.01); *H10P 72/3302* (2026.01); *H10P 72/3402* (2026.01); *H10P 72/3404* (2026.01)

(58) Field of Classification Search
CPC ......... H01L 21/67778; H01L 21/67775; H01L 21/68707; H01L 21/67709;
(Continued)

(56) References Cited

U.S. PATENT DOCUMENTS 11,990,357 B2 * 5/2024 Hatano ............. H01L 21/67742
2003/0129045 A1 * 7/2003 Bonora ............. H01L 21/67709
414/217
(Continued)

FOREIGN PATENT DOCUMENTS

DE 44 41 512 A1 6/1995
DE 10 2004 037 622 A1 2/2006
(Continued)

OTHER PUBLICATIONS

International Search Report corresponding to PCT Application No. PCT/EP2021/073955, mailed Jan. 5, 2022 German and English language document) (7 pages).

*Primary Examiner* — Kaitlin S Joerger
(74) *Attorney, Agent, or Firm* — Maginot, Moore & Beck LLP

(57) ABSTRACT

The disclosure relates to a conveyor device which is designed to simultaneously convey a plurality of payloads, in particular wafers. Each payload is paired with a transport body (mover) which can be moved and positioned in a floating manner over a surface of a stator, and the transport body is moved and positioned preferably with respect to all six degrees of freedom. The transport body and the paired payloads are received in a sealed transport chamber, the stator is arranged below the sealed transport chamber, the floor of the transport chamber is arranged above the surface of the stator and parallel thereto, and the housing of each transport body is likewise preferably sealed.

20 Claims, 5 Drawing Sheets

(58) Field of Classification Search
     CPC ........... H01L 21/67766; H10P 72/3411; H10P
                72/3404; H10P 72/3402; H10P 72/3302
     See application file for complete search history.

(56)                    References Cited

U.S. PATENT DOCUMENTS

| | | | | |
|---|---|---|---|---|
| 2007/0013642 | A1* | 1/2007 | Yoon | H01L 21/67736 |
| | | | | 345/100 |
| 2011/0038692 | A1 | 2/2011 | Hofmeister et al. | |
| 2012/0213614 | A1 | 8/2012 | Bonora et al. | |
| 2015/0037122 | A1* | 2/2015 | Schellenberger | ............................ |
| | | | | H01L 21/67739 |
| | | | | 414/222.07 |
| 2015/0214086 | A1 | 7/2015 | Hofmeister et al. | |
| 2016/0218029 | A1* | 7/2016 | Janakiraman | H01L 21/67709 |
| 2017/0331359 | A1* | 11/2017 | Paweletz | H02K 41/031 |
| 2017/0352562 | A1 | 12/2017 | Kurita et al. | |
| 2018/0308735 | A1 | 10/2018 | Janakiraman et al. | |
| 2020/0111692 | A1 | 4/2020 | Newman et al. | |
| 2021/0249291 | A1* | 8/2021 | Raatz | B65G 54/02 |
| 2021/0265188 | A1* | 8/2021 | Moura | H01L 21/67161 |

| | | | | |
|---|---|---|---|---|
| 2022/0037181 | A1* | 2/2022 | Hatano | H01L 21/67196 |
| 2022/0223447 | A1* | 7/2022 | Hatano | H01L 21/67173 |
| 2022/0301921 | A1* | 9/2022 | Shindo | H01L 21/67167 |
| 2023/0143307 | A1* | 5/2023 | Moura | H01L 21/67161 |
| | | | | 361/144 |
| 2023/0154777 | A1* | 5/2023 | Shimamura | B08B 13/00 |
| | | | | 414/806 |
| 2023/0307278 | A1* | 9/2023 | Li | H01F 7/206 |
| 2023/0360943 | A1* | 11/2023 | Teusch | H01L 21/67769 |
| 2024/0153803 | A1* | 5/2024 | Prasad | H01L 21/67706 |
| 2024/0174459 | A1* | 5/2024 | Raatz | B65G 47/90 |

FOREIGN PATENT DOCUMENTS

| | | |
|---|---|---|
| DE | 10 2013 218 394 A1 | 3/2015 |
| DE | 10 2014 102 630 A1 | 8/2015 |
| DE | 10 2016 224 951 A1 | 6/2018 |
| DE | 10 2018 006 259 A1 | 12/2019 |
| EP | 3 582 376 A1 | 12/2019 |
| JP | H8-12077 A | 1/1996 |
| JP | 2004-265894 A | 9/2004 |
| JP | 2010-41888 A | 2/2010 |
| JP | 2019-520701 A | 7/2019 |

* cited by examiner

CONTACTLESS CONVEYOR DEVICE

This application is a 35 U.S.C. § 371 National Stage Application of PCT/EP2021/073955, filed on Aug. 31, 2021, which claims the benefit of priority to Serial No. DE 10 2020 212 223.7, filed on Sep. 29, 2020 in Germany, the disclosures of which are incorporated herein by reference in their entirety.

SUMMARY

The disclosure relates to a contactless conveyor device. In particular, the conveyor device according to the disclosure is suitable for industrial applications in assembly technology, the biological, chemical, pharmaceutical and food industries, and in solar cell/display manufacturing, medical technology, laboratory automation, and logistics. The use of the conveyor device in the semiconductor industry is particularly preferred.

Background

In the context of technical manufacturing, objects or payloads such as materials, workpieces, tools or products must often be transported or positioned. Both contacting and contactless conveyor devices are known for this purpose, which are used in mechanical and plant engineering, for example, for transporting objects or payloads in packaging machines, for positioning machine elements or for aligning tools as precisely as possible with the workpiece, for example, for laser processing, or in the semiconductor industry for coating, exposing or structuring substrates in wafer cluster or stepper systems. Systems for the levitation of objects can be used here.

One challenge in magnetic levitation is to create a structure stably floating in a magnetic field. Another challenge is to automatically position and/or move the floating structure according to a target specification in all six degrees of freedom (three each in translation and rotation), which is also called full magnetic levitation.

DE 10 2016 224 951 A1 allows controlled conveyance and positioning of a transport body carrying a payload relative to a stator, in that one of the two elements has a plurality of at least partially movably arranged actuating magnets of which the relevant position and/or orientation relative to this element can be specified in a controlled manner via actuating elements, and the other of the two elements has at least two stationary magnets immovably connected to this element, the stationary magnets being magnetically coupled to actuating magnets. The conveyor device is designed to convey the transport body relative to the stator by a controlled positioning and/or orientation of actuating magnets. In the process, the transport body is also brought into and held in a desired position and/or orientation relative to the stator.

This allows complete magnetic levitation of the transport body in six degrees of freedom, i.e., in three translational and three rotational degrees of freedom relative to the stator. This has the advantage that the conveying of the transport body can take place more flexibly.

Furthermore, DE 10 2016 224 951 A1 offers the advantage that a levitation and/or a forward movement of the transport body relative to the stator is made possible by a corresponding positioning and/or orientation of the actuating magnets by means of the respective actuating elements. This makes it possible to dispense with providing a complex arrangement and controlling of magnetic coils. This not only reduces the complexity of the conveyor device and thus the production costs, but also allows the use of permanent magnets which can often provide a much larger flux density than magnetic coils usable for such purposes. This can in turn allow a larger lift height or a larger gap between the stator and the transport body, which can result in a greater freedom of movement during movements in the Z-direction and or in the pitch and roll angle range. Furthermore, this offers the advantage that an interruption of the supply of electrical energy does not necessarily have to lead to a malfunction or even to cause damage. In particular, an interruption of the power supply does not lead to a loss of the magnetic field or the magnetic coupling between the stator and the transport body. For example, in the event of an interruption of the power supply, the coupling forces between the actuating magnets and the stationary magnets can increase as soon as the position and/or the orientation of the actuating magnets yields to the attractive force effect of the stationary magnets, whereupon the transport body is pulled onto the stator and is thus secured against uncontrolled falling down. The magnetic coupling between the stator and the transport body can bring about both a levitation of the transport body, i.e., a lift above the stator, and a movement of the transport body relative to the stator, i.e., conveying, without further contacting or contactless systems being absolutely necessary for this purpose. This allows contactless transport, so that the disclosed conveyor device can also be used in environments with increased cleanliness requirements. For example, the transport body can be conveyed in the environment with the increased cleanliness requirement, while the stator is arranged outside in an environment with lower cleanliness requirements. Separating elements can extend through a gap between the stator and the transport body in order to separate the different cleanliness areas. Thus, the disclosed conveyor device is also suitable for use in biological, chemical and/or pharmaceutical methods, and for example in gas-tight, liquid-tight, and/or encapsulated areas.

In a typical semiconductor manufacturing line, wafers are processed on production lines and are transported between the production lines by conveyor devices. Typically, wafers are transported under normal pressure in transport containers, the transport being carried out as a batch with a typical batch size of 25 pieces.

Within a production line (cluster tool), the wafers are usually processed and transported under ultra-high vacuum (UHV). A production line comprises at least one processing station for processing the wafers, a conveyor device for transporting the wafers in a vacuum, and a storage area for storing unprocessed and processed wafers. The at least one processing station, the conveyor device, and the storage area are enclosed in vacuum-tight chambers and can be evacuated to UHV. The chambers are arranged laterally adjacent to one another and are connected to one another, via vacuum-tight locks if necessary.

To transfer the wafers between the transport container and the production line and to store a plurality of wafers in the vacuum area, a so-called vacuum load lock is located on the production line. The transport container is inserted under normal pressure into the vacuum load lock, and the vacuum load lock is then evacuated. A vacuum lock then opens between the vacuum load lock and the conveying area of the cluster tool, and the wafers are removed from the transport container or inserted into the transport container through the lock by the conveyor device.

After all wafers have been removed from the transport container, processed and placed back in the transport container, the vacuum lock is closed and the vacuum load lock is ventilated. Subsequently, the transport container is removed from the vacuum load lock under normal pressure and transported to the next cluster tool.

The ventilation of the wafers can impair the wafer surface and lead to reduced yield. To reduce this effect, in some cluster tools the wafer is coated with a protective layer in the final process step, preparing it for transport under normal conditions. The protective layer must be removed again before the next processing step.

This disadvantage also applies to the conveyor device for wafers according to DE 10 2018 006 259 A1.

In contrast, the problem addressed by the disclosure is that of creating a conveyor device for payloads, in particular for wafers, which have to be processed in various processing stations in a special environment, i.e., not under normal conditions. The transport of the payloads by means of the conveyor device should also be made possible in a special environment, i.e., not under normal conditions.

This problem is solved by a conveyor device having the features of the disclosure.

Further advantageous embodiments of the disclosure are described in the description.

The disclosed conveyor device is designed to simultaneously convey a plurality of payloads, in particular wafers, wherein each payload is paired with a transport body (mover) which can be moved and positioned in a floating manner over a surface of a stator. Preferably, the movement and the positioning are brought about with respect to all six degrees of freedom. According to the disclosure, the transport bodies and the paired payloads are received in a sealed transport chamber. The stator is arranged below the sealed transport chamber. The floor of the transport chamber is arranged above the surface of the stator and parallel thereto. Preferably, the housing of each transport body is likewise preferably sealed. This creates a conveyor device for payloads, in particular wafers, which can be processed in different processing stations in a special environment, i.e., not under normal conditions. The transport of the payloads by means of the transport body of the conveyor device according to the disclosure likewise takes place in a special environment, i.e., not under normal conditions.

The transport chamber can also be referred to as a transport housing and can be rectilinear and elongate and tunnel-like. The floor can be road-like.

Preferably, a gas (e.g., protective gas, nitrogen, or inert gas) or a gas mixture (e.g., purified air) or a vacuum or an ultra-high vacuum (e.g., up to 10-7 or up to 10-8 bar) or an aseptic area or an ABC-protected area or a liquid (e.g., up to 2 bar) is provided in the transport chamber.

For example, if the ultra-high vacuum (UHV) is provided, without the appropriate UHV-tight housings for the transport bodies the vacuum would penetrate there. On the one hand, it could damage the components (e.g., the electronic components or a rechargeable battery), and on the other hand, these components (especially the rechargeable battery and electrolytic capacitors on the printed circuit board) could outgas and thus disturb the buildup of the ultra-high vacuum in the transport chamber. In order to avoid this, the (preferably lifetime) UHV-tight housings of the transport bodies are a suitable solution. Alternatively, a construction of the transport body from vacuum-compatible components in an open housing is provided, which makes penetration of the atmosphere or the vacuum possible.

Adjacent to the transport chamber, the processing stations can be arranged in process chambers, each transport body having a receptacle for the payload. Preferably, an extension arm (end effector) is provided, at the end portion of which that is remote from the housing a receptacle for the payload is provided or formed. The stator does not extend below the process chambers. In special cases, a separate stator under a process chamber could be useful.

The process chambers should be shielded from the magnetic fields of the stator, as these magnetic fields can interfere with the processes taking place in the process chambers.

To weaken a magnetic field of the stator with respect to the process chambers, a relevant distance between the stator or the transport chamber and the process chambers is particularly preferably provided, which distance can be bridged with the extension arm. For example, the extension arm can be of such a length that a free lateral distance between the housing and the receptacle for the payload corresponds at least to the extension of the housing and/or the extension of the payload. These extensions are viewed in the direction of the extension arm. In the case of the wafer, this extension is its diameter.

An additional dipole compensation magnet can also be used below an actuating magnet array of the stator for far-field compensation. It causes the sum of all dipole moments in an actuating magnet array to be equal to zero, which very effectively cancels out far fields in particular.

The actuating magnets which are currently not required for the levitation can also be moved actively into an angular position which facilitates the cancellation of the magnetic far field at the adjacent process chamber.

A magnetic field shielding made of a material with a high permeability number is also possible. Ideally, the entire stator is placed in a continuous "iron pot" that completely covers the lower half-space up to the surface of the stator. Suitable for this are iron sheets, especially made of mu-metal. However, ferrite ceramic could also be used.

In principle, the particular environment of the transport chamber and the particular environment of the processing stations or of the process chambers can be the same or different.

In the first case, the process chambers can be designed as secondary spaces directly connected to the transport chamber.

In a preferred application of the conveyor device according to the disclosure, the transport bodies move within a cluster tool under ultra-high vacuum. Nevertheless, there can be individual process chambers which have a different vacuum or a gas atmosphere during the processing and are therefore separated from the transport chamber by a lock.

Preferably, an optical position sensing device is provided that has at least one camera and a common flat (e.g., less than 1 mm) two-dimensional code arrangement for each transport body. The code arrangement is arranged passively or without power on the floor of the transport chamber.

At least one permanent magnet array is arranged in the housings of the transport bodies (preferably on the relevant floor of the housings), which array can be brought into operative connection with the stator and moved thereby. Thus, no power supply of the transport bodies is necessary with respect to the drive technology. The at least one permanent magnet array may be annular. The housing may have a plurality of permanent magnet arrays.

A center of the permanent magnet array is particularly preferably arranged in the center of gravity of the relevant transport body. The center of gravity can be calculated or ascertained with or without a payload.

For this purpose, a counterweight can be arranged in a region of the housing opposite the extension arm.

The counterweight can be in the form of a solid body (for example in the form of a metal block) or in the form of a tank in which a liquid is carried. Optionally, the counterweight can be displaced spatially, in particular displaced in the direction of the extension arm, in order to adapt the transport body to different loads.

A service station for the transport bodies can be arranged in the transport chamber, which station is approached cyclically or as required by the transport bodies and can thus be brought into operative connection therewith.

Different counterweights can be provided for different payloads. The service station can have a changing station for the counterweights of the transport bodies.

The dissipation of heat from the transport body can be problematic for use in a vacuum, since, in this case, of the three fundamental heat transport mechanisms—heat conduction (by mechanical contact), convection (by a flow of gas or air) and heat radiation (electromagnetic effect)—only heat radiation works. If the heat input into the transport bodies due to self-heating and/or external heating is greater than the heat radiation, the transport bodies continue to heat up until thermal equilibrium is established. To prevent overheating, measures are provided for heat dissipation, in particular for application in a vacuum.

In a preferred embodiment of the heat dissipation concept, a heat storage device absorbs the thermal energy (i.e., the temperature of the heat storage device increases continuously) over a certain operating period (e.g., several hours) and is replaced or cooled at intervals at the service station (thermal discharge).

From the point of view of the device, it is particularly advantageous if the counterweight and the heat storage device are formed together by a metal block (e.g., made of brass). The counterweight and heat storage device can also be formed from a plurality of metal blocks to match the load state of the transport body.

The service station can have a device for charging or changing the electrical energy storage device, for example a rechargeable battery, in the transport body. The energy storage device supplies power to, e.g., the position sensing device.

Payloads such as wafers, which are endangered by the action of electrostatic discharge, are protected by measures for dissipating the static electricity.

A safety design preferably allows the transport bodies and the conveyed payloads to be brought into a safe holding state without damage in the event of a power failure and, after restarting of the power supply, to automatically resume operation.

BRIEF DESCRIPTION OF THE DRAWINGS

An exemplary embodiment of the conveyor device according to the disclosure with two exemplary embodiments of transport bodies is shown in the drawings.

In the drawings.

DETAILED DESCRIPTION

Figure 1:
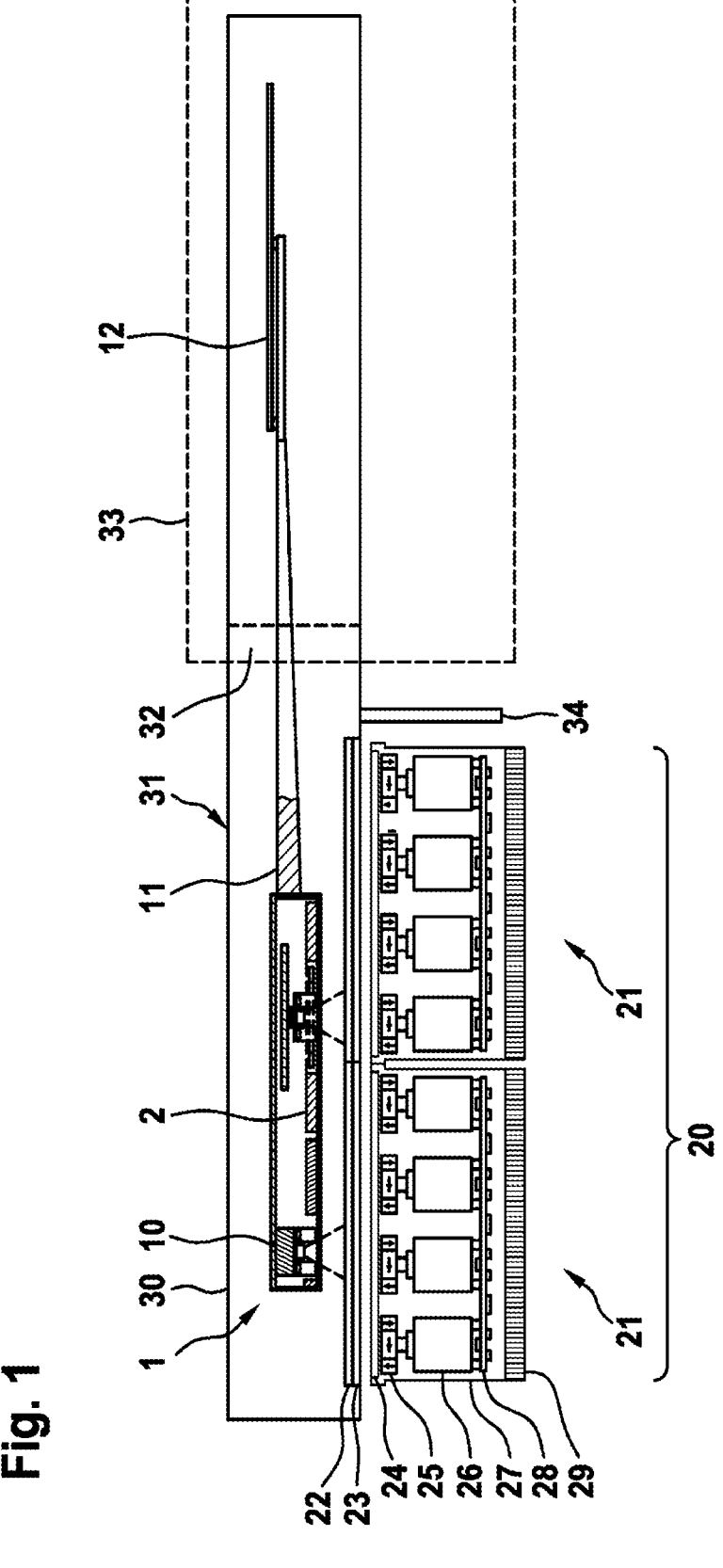
FIG. 1 shows the conveyor device according to the disclosure in a cross-section.

FIG. 1 shows an exemplary embodiment of the conveyor device. It has a stator 20 made up of a plurality of drive modules 21, and at least one transport body 1, wherein the conveyor device is configured to convey and position the at least one transport body 1 on the stator 20 in a controlled manner relative to the stator 20.

The conveyor device is configured for the contactless transport of wafers 12 in semiconductor manufacturing in a gas atmosphere or in vacuum conditions. The transport bodies 1 can be moved automatically according to a target specification in all six degrees of freedom (three translations X, Y, Z and three rotations rot_X, rot_Y, rot_Z). A transport chamber 30 is designed as a transport line of which the main transport direction extends perpendicularly to the plane of the drawing. In particular an ultra-high vacuum (approximately 10-7 bar) can prevail in the transport chamber 30. Adjacent process chambers 33 are arranged laterally to the transport chamber 30, of which only one process chamber 33 is shown by way of example in FIG. 1.

An extension arm 11, which is used to hold the wafer 12, is attached to the transport body 1. The extension arm 11 increases the lateral distance between the wafer 12 and the transport body 1, so that the wafer 12 can be inserted into the process chambers 33. If necessary, there is a lock 32 which is opened for the loading of the process chamber 33. The long extension arm 11 and the free positionability of the transport body 1 allow the wafer 12 to be introduced into the process chamber 33 even if the opening of the lock 32 is not significantly larger than the diameter of the wafer 12.

Figure 2:
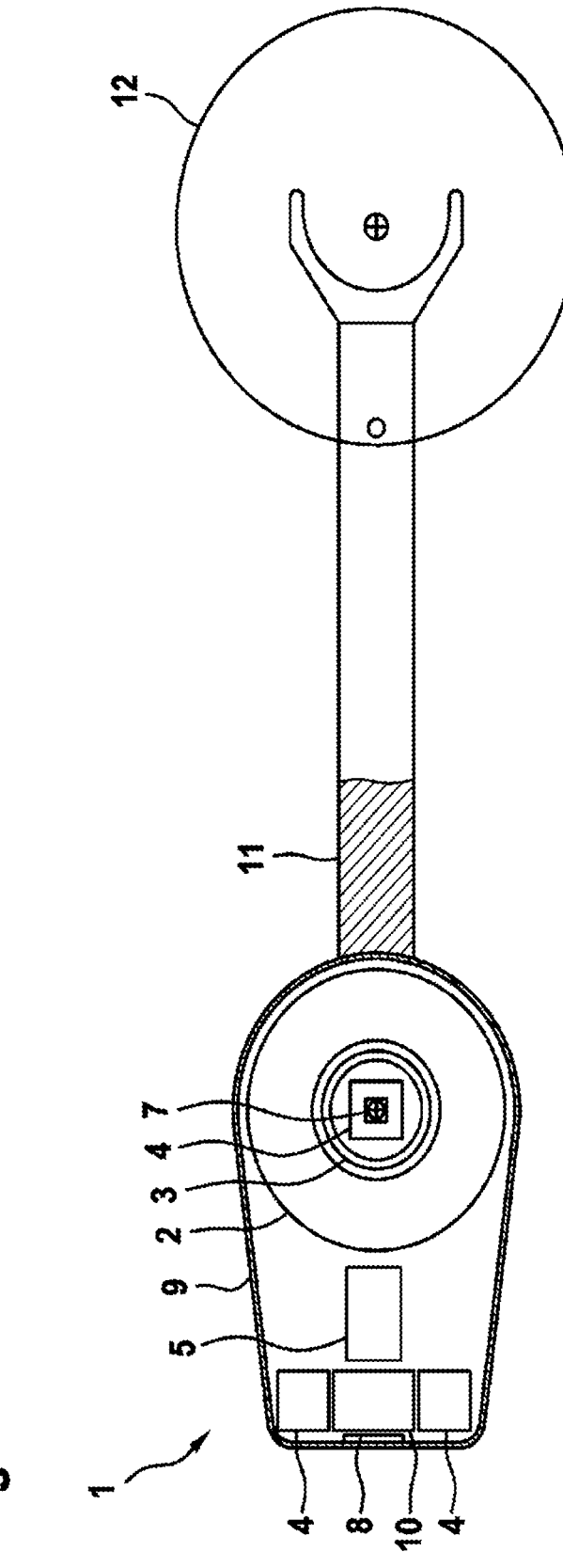
FIG. 2 shows the first exemplary embodiment of the transport body from FIG. 1 in a partially sectioned plan view.

The structure of the first exemplary embodiment of the transport body 1 is shown in FIG. 2. The transport body 1 can be used under different atmospheric conditions. In particular, it can be operated in an ultra-high vacuum. It can be operated in various gases and gas mixtures.

For this purpose, the transport body 1 has a vacuum-tight and pressure-tight sealed housing 9, which separates the atmosphere in the interior of the transport body from the outer atmosphere, e.g., the atmosphere inside the transport chamber 30. Optionally, there is a ventilation valve in the housing 9, which is regularly closed and allows pressure equalization in the housing 9 or a gas exchange as needed. Preferably, the interior of the housing 9 is under normal pressure.

The housing 9 is made, for example, of metal, plastics material, ceramic, glass or a composite of materials. Glass plates are embedded in the floor of the housing 9, allowing camera modules 4 inside the housing 9 to optically capture a two-dimensional code arrangement 23 at the floor of the transport chamber 30.

Figure 3:
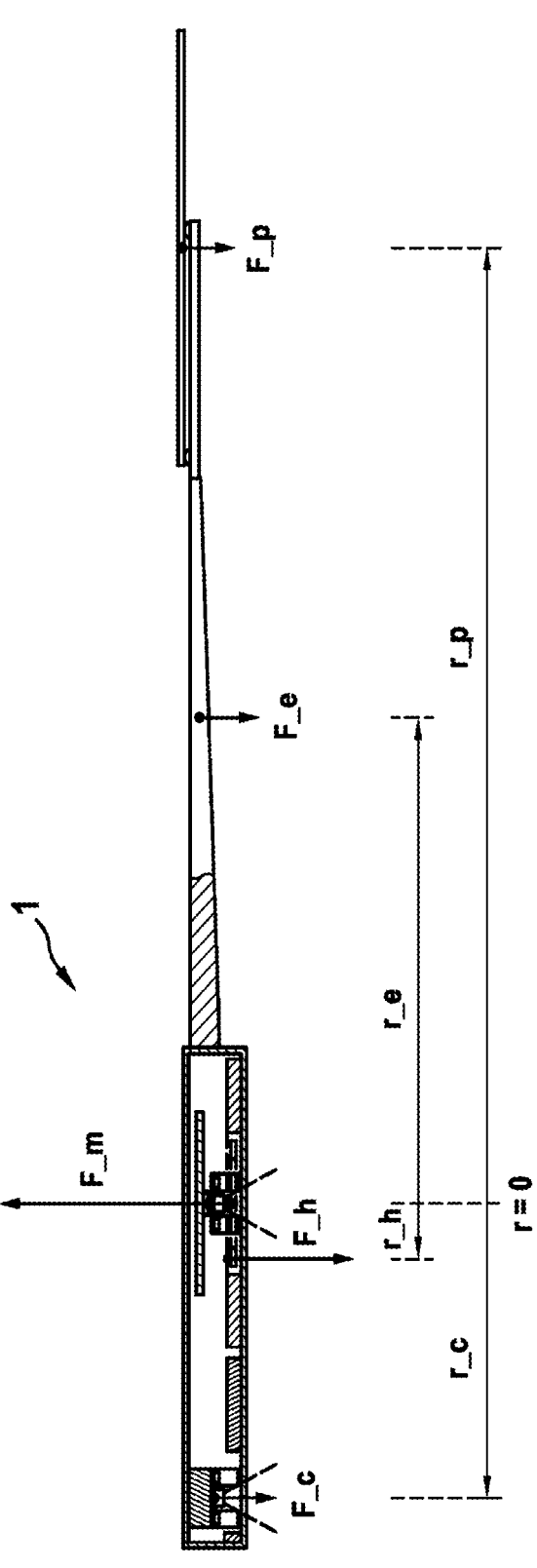
FIG. 3 shows the transport body from FIGS. 1 and 2 in a longitudinal section.

According to a drive principle known in principle from the prior art, in the first exemplary embodiment according to FIGS. 1 to 3 the transport body 1 has a, for example, circular annular array of permanent magnets 2, preferably as a Halbach arrangement in the form of a circular ring, for introducing the drive forces and torques. The Halbach arrangement has the effect that the side of the permanent magnet array 2 facing the stator 20 has a strong magnetic field and the side facing the transport surface has a weak magnetic field.

The influence of the magnetic far field of the conveyor device on the processes is minimized by the distance between the transport chamber 30 and the process chamber 33 being maximized. For this purpose, the extension arm 11 has a corresponding length. Another measure is the magnetic shielding 34 of the stator 20 using standard measures, such as ferromagnetic material or a multilayer, the material having a particularly high permeability number (e.g., iron sheet, ferrite, mu-metal).

Furthermore, a position determination unit is integrated in the conveyor device, preferably based on a plurality of camera modules 4 per transport body 1 and an inertial sensor 7. Each camera module 4 periodically captures a digital image of a section of the two-dimensional code arrangement 23. By evaluating the image information, it is able to determine its own position in up to six dimensions.

FIG. 2 shows the transport body 1 with three camera modules 4 located at widely separated points of the housing 9. This maximizes the base distance between the camera modules 4, increasing the accuracy of the angle detection.

The positions detected by a plurality of camera modules 4 are partially redundant due to their rigid mechanical arrangement in the housing 9. The redundancy can be used to increase the accuracy of the calculated position of the transport body 1, for example by averaging over the position data determined by a plurality of camera modules 4. In addition, incorrect measurements of individual camera modules 4 can be recognized and corrected with a diagnostic function by comparing and checking the plausibility of the independently obtained position values. If a position value deviates strongly from the others, it is treated as an incorrect measurement and is not included in the evaluation.

In the exemplary embodiment shown, the inertial sensor 7 is provided in the housing 9. It has a fixed dimensional relationship to the camera modules 4. The inertial sensor 7 is preferably designed to determine all six degrees of freedom, i.e., it preferably comprises a combination of at least one 3D acceleration sensor and at least one 3D rotation rate sensor. Alternatively, the inertial sensor 7 can be designed to determine fewer than six degrees of freedom, such as, for example, only the translational and/or rotational degrees of freedom.

Figure 5:
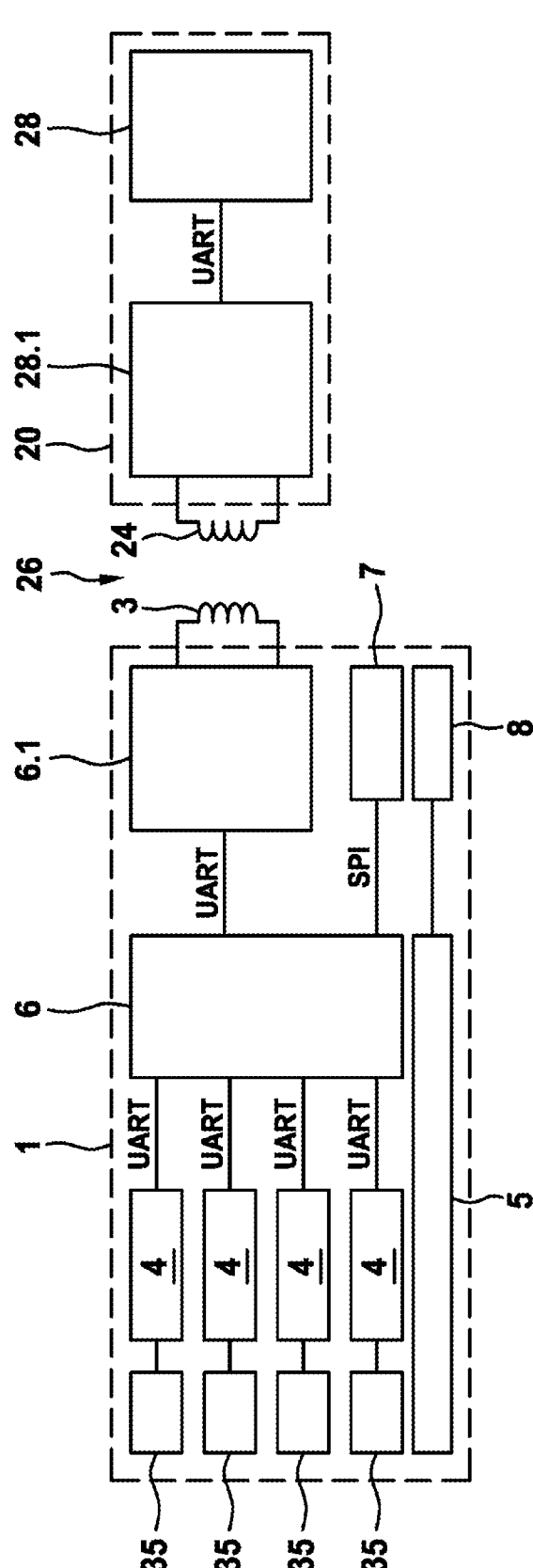
FIG. 5 shows a circuit diagram of electronic assemblies of the conveyor device from FIG. 1 with the transport body from FIGS. 4*a* and 4*b*.

FIG. 5 shows that the camera modules 4, which illuminate the code arrangement 23 with their LEDs 35, and the inertial sensor 7 provide their measurement signals and/or measurement data to the control unit 6 of the transport body 1. The control unit 6 determines the position of the transport body 1 by fusing the sensor data. In particular, the control unit 6 is designed to recognize the temporary failure of one or more camera modules 4 and/or to determine the position of the transport body 1 on the basis of the measurement data of the inertial sensor 7 in the event of detection problems.

The control unit 6 in the housing 9 of the transport body 1 transmits the calculated position or intermediate values, possibly with additional information, to the stator 20 via a wireless communication interface. A wireless inductive data transmission is preferably used. Here, the binary serial data stream is frequency-coded using an FSK modem 6.1 and is converted into a variable magnetic field via a transport body coil 3. Also located in the stator 20 is a coil 24 which, due to its spatial arrangement, is inductively coupled to the transport body coil 3 via a gap 26. The signal received by the stator coil 24 is demodulated by an FSK modem 28.1 in the stator 20 and converted to a serial data stream.

In order not to block the inductive coupling of the transport body coil 3 in the process chamber 33 and the stator coil 24 outside the process chamber 33 via the gap 26, it is necessary to make the floor of the process chamber 33 in the working area of the transport body 1 predominantly from non-metal materials. Alternatively, the stator coil 24 is not integrated in the stator 20 but rather in the process chamber 33, for example below the two-dimensional code arrangement 23. The electrical connection of the stator coil 24 to the stator 20 is guided through a power feedthrough in the wall of the process chamber 33.

As an alternative to the inductive data transmission, radio transmission or optical data transmission can be used, for example, wherein further LEDs and photodiodes can be provided in the housing 9 of the transport body 1 and in the stator 20, which are used for information transmission.

According to FIG. 2, the transport body 1 is equipped with an electrical energy storage device 5 for the wireless operation of the body. Preferably, a rechargeable battery is used, for example a lithium polymer battery (LiPo), a lithium iron phosphate battery (LFP) or a lithium-titanate battery (LTO), which is characterized by high operational reliability and high cycle stability (durability). Alternatively, a capacitor with high storage capacity can be used (supercap).

During operation, the energy storage device 5 is constantly subject to load and continuously discharges. Therefore, it is cyclically charged or recharged at fixed intervals or as required. For this purpose, a device for contacting or contactless energy transmission 8 is provided.

The contacting energy transmission takes place, for example, via charging contacts on the outside of the housing 9, which are connected to the charging electronics inside the housing 9 via a power feedthrough.

Contactless energy transmission can take place by inductive coupling between two coils, of which one is arranged in the housing 9 and the other is arranged outside it, wherein the housing 9 in the coupling region consists predominantly of non-metal material in order not to dampen the coupling. Alternatively, the energy transmission can take place optically, with a solar cell with high efficiency attached to the outside of the transport body 1.

Finally, the energy storage device 5 can be designed as an exchangeable component which is located outside the housing 9 and is mechanically and electrically connected to the transport body 1. The connection is designed to be detachable, so that a discharged energy storage device 5 can be exchanged for a charged energy storage device 5 within a short time.

Charging can take place outside regular operation or during operation. When using an energy storage device 5 with a low capacity, such as a capacitor, it is preferably recharged in a contactless manner during operation.

FIG. 3 shows the equilibrium state of the floating transport body 1 from FIG. 2 with its extension arm 11 and the wafer 12. In equilibrium, the vector sum of all forces acting on the transport body 1 is equal to 0N, and the vector sum of all torques is equal to 0 Nm. Here, the lever arms shown are considered to be the distances $r\_c$, $r\_h$, $r\_e$ and $r\_p$ of the individual centers of gravity from the point at which the magnetic force $F\_m$ is introduced into the permanent magnet array 2. In the static state, the equilibrium is achieved by the weight of the transport body 1 with all the units attached thereto being compensated for by a force $F\_m$ that is equal and opposite and that is introduced into the transport body 1 via the permanent magnet array 2. Furthermore, the sum of all torques acting on the transport body 1 is compensated for with an oppositely acting torque which is introduced via the permanent magnet array 2.

The long extension arm 11 and the wafer 12 on the extension arm 11 continuously exert a high torque on the transport body 1. Optionally, at least one counterweight 10 generates a counter-torque, thus reducing the remaining torque that must be compensated for by the permanent magnet array 2. At the same time, it increases the total weight of the transport body 1. The use of a counterweight 10 thus reduces the torque load of the transport body 1 and increases the force load. This is particularly useful when the operating range of the torque has already been exhausted, but the operating range of the force still has reserves.

The counterweight 10 can be integrated in the housing 9 of the transport body 1, can be mounted as a separate component outside the housing 9, or can be distributed over a plurality of mounting locations. In a further variant, the counterweight 10 with the extension arm 11 forms a structural unit which is fastened to the housing 9.

The conveyor device can be configured to automatically pick up or put down a separate counterweight 10 and/or the extension arm 11 with the transport body 1 in order to adapt the weight distribution or the extension arm 11 to an imminent conveying task.

Figure 4:
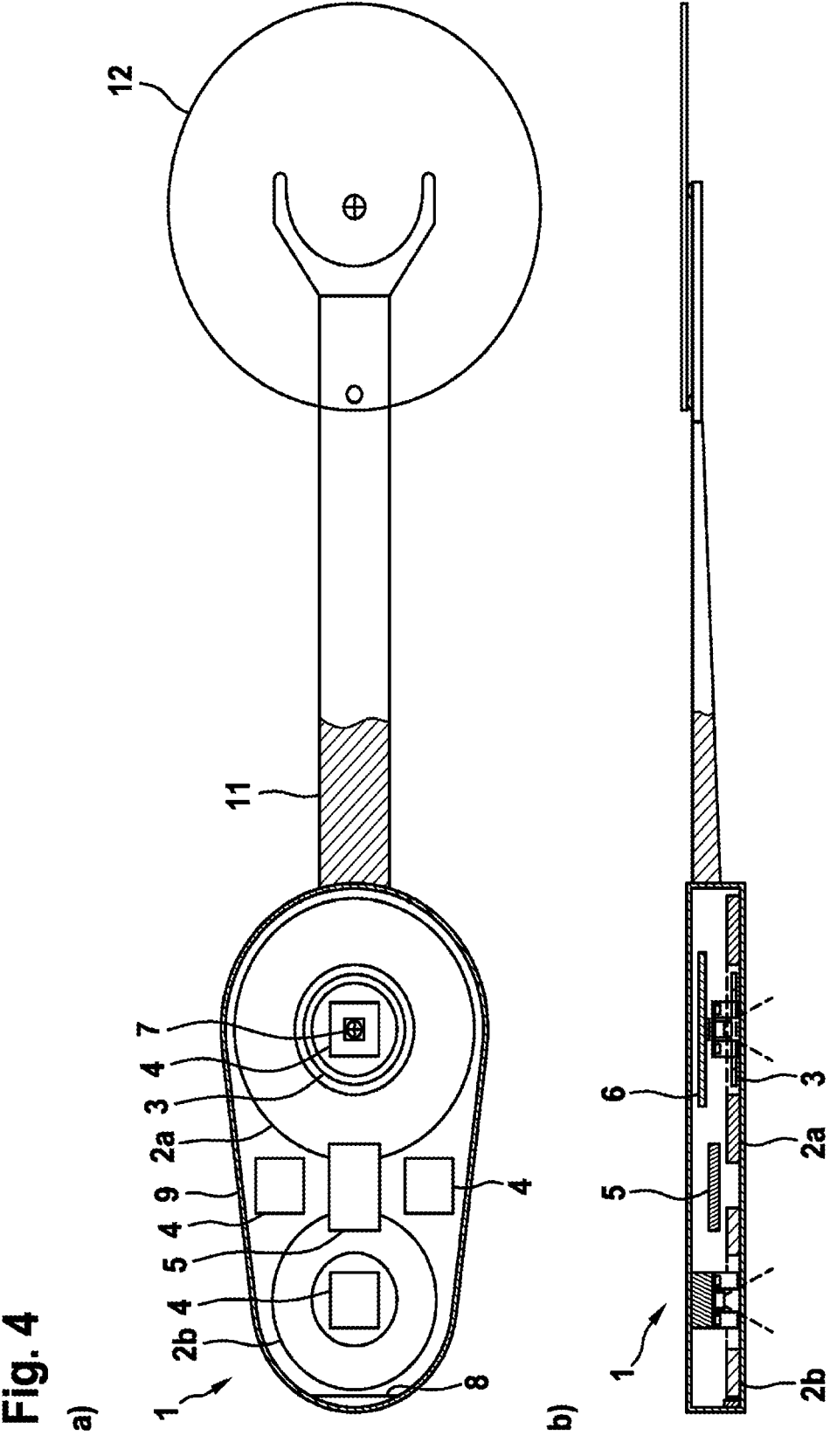
FIG. 4*a* shows a second exemplary embodiment of the transport body for use in the conveyor device according to the disclosure from FIG. 1 in a partially sectioned plan view.
FIG. 4*b* shows the transport body from FIG. 4*a* in a longitudinal section.

FIG. 4 shows a transport body 1 according to a second embodiment with a distributed permanent magnet array 2. The permanent magnet array 2 consists of two annular partial arrays 2a and 2b, which are mechanically fixedly connected to one another via the housing 9. They can be treated by the control system in the same way as the continuous permanent magnet array 2 shown in FIGS. 2 and 3.

The largest dimension of the permanent magnet array 2 preferably extends in the direction of the extension arm 11. This arrangement expands the working area of the permanent magnet array 2 in a targeted manner, so that it can output higher torques M_m to compensate for the load by the extension arm 11 and the wafer 12. In this way, a counterweight 10 can be dispensed with, given suitable dimensioning.

During operation, the transport body 1 may heat up, both due to external effects (for example, when used in close proximity to a heating process) and due to the power loss of the electrical components in the transport body 1. In order to avoid overheating, heat dissipation from the transport body 1 is necessary. Particularly during operation in a vacuum, this represents a challenge, since during the levitation operation there is no possibility for heat conduction or cooling by convection.

In order to improve the heat dissipation of the transport body 1 by thermal radiation, the surface of the transport body 1 has a high emissivity. For example, the emissivity of a metal housing 9 is increased by coating or structuring the surface. In addition, the heat sources in the housing 9, for example electronic components such as microprocessors, are thermally connected to the housing 9 in order to promote the heat dissipation.

An additional measure is to collect the lost heat in a heat storage device in the transport body 1. The heat storage device can be in the form of an additional component (not shown) or can form a functional unit with the counterweight 10 by said counterweight being additionally used as a heat storage device. The heat storage device can consist of a solid body or a liquid-filled tank, with a liquid with a high specific heat capacity being used as the storage medium.

Particularly preferred is the embodiment of the heat storage device as a water tank which is integrated in the transport body 1 and at the same time takes over the function of the counterweight 10. The heat sources are thermally connected to the water tank, optionally supported by a pipe/hose connection or a micropump. Alternatively, a latent heat storage device can be used which uses the supplied thermal energy for phase transformation from solid to liquid and in this way stores the heat.

During a brief interruption of the regular operation of the transport body 1, the thermal discharge takes place by exchanging the heat storage device or the heat storage device medium, or by dissipating the heat from the heat storage device, by bringing it into contact with a cold plate of a service station over a large area, for example. The thermal discharge takes place cyclically after a defined operating time or when a critical temperature threshold is exceeded.

In order to efficiently use the time of the operational interruption, the electrical charging process and the thermal discharge process can take place at the same time.

To prevent damage to the wafer 12 by electrostatic discharge, electrical contact may be made between the extension arm 11 and a nest before a wafer 12 is picked up or deposited in the nest. For this purpose, there is a spring-loaded contact needle on the extension arm 11, which needle impinges in a punctiform manner on an electrically grounded contact surface on the nest immediately before the wafer 12 is deposited/picked up. The resetting force of the spring loading is small compared to the force of the transport body 1, so that the handling process is not impaired by the contacting process. Alternatively, the grounded and spring-loaded contact needle is situated in a stationary manner on the nest and contacts a contact surface on the extension arm 11.

In the event of a power failure, the transport body 1 together with the wafer 12 can be brought into a secure holding state. For this purpose, an uninterruptible power supply is provided, which supplies power to the conveyor device for a few seconds after a power failure. During this time, the transport bodies 1 are brought to a standstill in a controlled manner and are landed on the floor of the transport chamber 30 at the relevant location. After a complete power shutdown, a safety function causes the actuator magnet arrays 25 (cf. FIG. 1) to move automatically to a stable position under the influence of the magnetic coupling with the permanent magnet array 2 of the transport body 1 (mover clamping). In this position, the transport body 1 is also fixed on the floor of the es when the line is without power. In order to avoid particle transfer, the transport body 1 has at least three flat feet on the bottom of the housing, so that mechanical contact in the landed state is only punctiform, with a minimal contact surface.

After the power supply has been restarted, the controller can bring the transport body 1 back into levitation operation and continue the process sequence.

The position sensing device can be operated without an inertial sensor 7 if the measurement rate of the camera modules 4 is approximately exactly as great as the measurement rate of the inertial sensor 7, since in this case the inertial sensor 7 no longer provides a speed advantage.

The mounting locations of the camera modules 4 and the code arrangement 23 may be reversed: the camera modules 4 with the LEDs 35 are mounted in the stator 20, facing the bottom of transport body 1, where the code arrangement 23 is located.

If the inertial sensor 7 is omitted and the camera modules 4 are installed in the stator 20, the transport body 1 can be operated without power. This eliminates many components in the transport body 1, and the transport body 1 is then a purely mechanical unit. The problem of cooling the transport body 1 is eliminated, since electronics that emit lost heat are no longer located in the transport body 1.

Disclosed is a conveyor device which is designed to simultaneously convey a plurality of payloads 12, in particular wafers, wherein each payload 12 is paired with a transport body 1 (mover) which can be moved and positioned in a floating manner over a surface of a stator 20. Preferably, the movement and the positioning are brought about with respect to all six degrees of freedom. The transport bodies 1 and the paired payloads 12 are received in a sealed transport chamber 30. The stator 20 is arranged below the sealed transport chamber 30. The floor of the transport chamber 30 is arranged above the surface of the stator 20 and parallel thereto. The housing 9 of each transport body 1 is likewise sealed.

LIST OF REFERENCE SIGNS

1 Transport body
2 Permanent magnet array
2a Partial array
2b Partial array
4 Camera module
5 Energy storage device
6 Control unit
6.1 FSK modem
7 Inertial sensor
8 Device for energy transmission
9 Housing
10 Counterweight
11 Extension arm
12 Payload/wafer
20 Stator
21 Drive module (of the stator)
22 Cover plate (of the drive module)
23 Code arrangement
24 Stator coil
25 Actuator magnet array
26 Gap
27 Housing (of the drive module)
28 Control unit (of the drive module)
28.1 FSK modem
30 Transport chamber
32 Lock
33 Process chamber
34 Shielding
35 LED
$F\_c$ Weight of the counterweight
$F\_h$ Weight of the housing and of the permanent magnet array and of the energy storage device
$F\_e$ Weight of the extension arm
$F\_p$ Weight of the payload
$F\_m$ Magnetic force
$r\_c$ Distance of the center of gravity of the counterweight
$r\_h$ Distance of the center of gravity of the housing and of the permanent magnet array and of the energy storage device
$r\_e$ Weight of the center of gravity of the extension arm
$r\_p$ Weight of the center of gravity of the payload

The invention claimed is:

1. A conveyor device configured to convey at least one payload, comprising:
   at least one transport body configured to be moved and positioned in a floating manner over a surface of a stator, wherein each at least one payload is paired with a respective one of the at least one transport body, wherein the at least one payload and the respective one of the at least one transport body are received in a sealed transport chamber, and wherein the stator is arranged outside the sealed transport chamber, wherein:
   a housing of the respective one of the at least one transport body is sealed,
   a plurality of process chambers configured to process the at least one payload are arranged adjacent to the transport chamber,
   the respective one of the at least one transport body has an extension arm, and an end portion of the extension arm that is remote from the housing includes a receptacle for the at least one payload,
   a counterweight is arranged in a region of the housing that is spaced apart from the extension arm,
   a service station is arranged in the transport chamber, the service station being configured to be brought into operative connection with the at least one transport body cyclically or as required, and
   the service station comprises a first changing station configured for changing the counterweight of the transport body.

2. The conveyor device according to claim 1, wherein the service station further comprises a cooling station or a second changing station configured for changing a heat storage device of the transport body.

3. The conveyor device according to claim 2, wherein the counterweight and the heat storage device are formed together by a metal block.

4. The conveyor device according to claim 1, wherein the service station further comprises a charging station or a second changing station configured for changing an electrical energy storage device of the transport body.

5. The conveyor device according to claim 1, wherein one of a gas, a gas mixture, a liquid, a vacuum, an ultra-high vacuum, an aseptic area, and an ABC-protected area is provided in the sealed transport chamber.

6. The conveyor device according to claim 1, wherein:
   the stator and the plurality of process chambers are spaced apart from one another by a relevant distance so as to weaken a magnetic field of the stator with respect to the plurality of process chambers,
   the extension arm is configured to bridge the relevant distance, and
   a distance between the housing and the receptacle for the payload corresponds at least to an extension of the housing and/or an extension of the payload in a direction of the extension arm.

7. The conveyor device according to claim 1, wherein at least one of the plurality of process chambers is separated from the transport chamber via a lock.

8. The conveyor device according to claim 1, further comprising:
   an optical position sensing device comprising:
      at least one camera in the housing of the transport body; and
      a flat code arrangement on a floor of the transport chamber.

9. The conveyor device according to claim 1, wherein at least one permanent magnet array is arranged in the housing of the transport body, and the at least one permanent magnet array is configured to be brought into operative connection with the stator and is configured to be moved by the operative connection with the stator.

10. The conveyor device according to claim 9, wherein a center of the at least one permanent magnet array is arranged at a center of gravity of the transport body.

11. A conveyor device configured to convey at least one payload, comprising:

at least one transport body configured to be moved and positioned in a floating manner over a surface of a stator, wherein each at least one payload is paired with a respective one of the at least one transport body, wherein the at least one payload and the respective one of the at least one transport body are received in a sealed transport chamber, and wherein the stator is arranged outside the sealed transport chamber, wherein a service station is arranged in the transport chamber, the service station being configured to be brought into operative connection with the at least one transport body cyclically or as required, and wherein the service station includes at least one of:

a cooling station or a first changing station configured for changing a heat storage device of the transport body, or a charging station or a second changing station configured for changing an electrical energy storage device of the transport body.

12. The conveyor device according to claim 11, wherein one of a gas, a gas mixture, a liquid, a vacuum, an ultra-high vacuum, an aseptic area, and an ABC-protected area is provided in the sealed transport chamber.

13. The conveyor device according to claim 11, wherein a housing of the respective one of the at least one transport body is sealed.

14. The conveyor device according to claim 13, wherein:

a plurality of process chambers configured to process the at least one payload are arranged adjacent to the transport chamber; and the respective one of the at least one transport body has an extension arm, and an end portion of the extension arm that is remote from the housing includes a receptacle for the at least one payload.

15. The conveyor device according to claim 14, wherein a counterweight is arranged in a region of the housing that is spaced apart from the extension arm.

16. The conveyor device according to claim 14, wherein:

the stator and the plurality of process chambers are spaced apart from one another by a relevant distance so as to weaken a magnetic field of the stator with respect to the plurality of process chambers, the extension arm is configured to bridge the relevant distance, and a distance between the housing and the receptacle for the payload corresponds at least to an extension of the housing and/or an extension of the payload in a direction of the extension arm.

17. The conveyor device according to claim 14, wherein at least one of the plurality of process chambers is separated from the transport chamber via a lock.

18. The conveyor device according to claim 11, further comprising:

an optical position sensing device comprising:

at least one camera in a housing of the transport body; and a flat code arrangement on a floor of the transport chamber.

19. The conveyor device according to claim 13, wherein at least one permanent magnet array is arranged in the housing of the transport body, and the at least one permanent magnet array is configured to be brought into operative connection with the stator and is configured to be moved by the operative connection with the stator.

20. The conveyor device according to claim 19, wherein a center of the at least one permanent magnet array is arranged at a center of gravity of the transport body.

* * * * *